(12) United States Patent
Miao et al.

(10) Patent No.: US 12,356,712 B2
(45) Date of Patent: Jul. 8, 2025

(54) DEVICE STRUCTURE FOR INDUCING LAYOUT DEPENDENT THRESHOLD VOLTAGE SHIFT

(71) Applicant: Apple Inc., Cupertino, CA (US)

(72) Inventors: Xin Miao, Saratoga, CA (US); Emre Alptekin, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/888,284

(22) Filed: Sep. 18, 2024

(65) Prior Publication Data

US 2025/0107229 A1      Mar. 27, 2025

Related U.S. Application Data

(60) Provisional application No. 63/585,395, filed on Sep. 26, 2023.

(51) Int. Cl.
*H10D 84/85* (2025.01)
*H10D 64/27* (2025.01)
(Continued)

(52) U.S. Cl.
CPC ......... *H10D 84/856* (2025.01); *H10D 64/517* (2025.01); *H10D 64/667* (2025.01);
(Continued)

(58) Field of Classification Search
CPC .... H10D 84/856; H10D 84/85; H10D 84/853; H10D 84/8311; H10D 84/8312; H10D 84/83135; H10D 84/83138; H10D 84/8314; H10D 84/8316; H10D 84/835; H10D 84/836; H10D 84/837; H10D 84/839; H10D 84/851; H10D 84/852; H10D 84/0135; H10D 84/0137; H10D 84/014;
(Continued)

(56) References Cited

U.S. PATENT DOCUMENTS 8,703,595 B2 * 4/2014 Chuang ................ H10D 64/258
257/E21.19
10,068,901 B2  9/2018 Kim et al.
(Continued)

FOREIGN PATENT DOCUMENTS

KR    10-2022-0104629 A    7/2022

OTHER PUBLICATIONS

International Search Report and Written Opinion in PCT Appl. No. PCT/US2024/047457 mailed Dec. 26, 2024, 10 pages.

*Primary Examiner* — Michael M Trinh
(74) *Attorney, Agent, or Firm* — Kowert, Hood, Munyon, Rankin & Goetzel, P.C.; Gareth M. Sampson; Dean M. Munyon

(57) ABSTRACT

Device layouts for integrated circuit devices that include threshold voltage shift induced by placement of alternate work function metals adjacent active gates are disclosed. The device layouts include a single epitaxy for active regions in the device with common source/drain regions among the active region rows in the layouts. Metal gate sections above one or more rows of active regions may be replaced with metal of a different work function in inactive regions of the layout. The different work function metal in the inactive regions will induce threshold voltage shift in adjacent (neighboring) active transistors of the device layouts.

20 Claims, 8 Drawing Sheets

(51) Int. Cl.
*H10D 64/66* (2025.01)
*H10D 84/01* (2025.01)
*H10D 89/10* (2025.01)

(52) U.S. Cl.
CPC ....... *H10D 84/0135* (2025.01); *H10D 84/014* (2025.01); *H10D 84/85* (2025.01); *H10D 84/853* (2025.01); *H10D 89/10* (2025.01)

(58) Field of Classification Search
CPC .. H10D 84/0142; H10D 89/10; H10D 64/667; H10D 64/668; H10D 64/669; H10D 64/517; H10D 64/518; H10D 64/519
See application file for complete search history.

(56) References Cited

U.S. PATENT DOCUMENTS

| | | | |
|---|---|---|---|
| 10,522,643 B2 | 12/2019 | Yang et al. | |
| 2015/0364459 A1 | 12/2015 | Chuang et al. | |
| 2016/0133632 A1* | 5/2016 | Park | H10D 84/853 257/369 |
| 2016/0163706 A1* | 6/2016 | Kim | H10D 30/797 257/369 |
| 2016/0351569 A1 | 12/2016 | Song et al. | |
| 2018/0240890 A1 | 8/2018 | Yang et al. | |
| 2018/0308772 A1 | 10/2018 | Seningen | |
| 2018/0315856 A1* | 11/2018 | Yang | H10D 30/024 |
| 2020/0083222 A1* | 3/2020 | Kim | H10D 84/0193 |
| 2020/0176447 A1* | 6/2020 | Pao | H10D 84/853 |
| 2020/0185383 A1* | 6/2020 | Kim | H10D 64/111 |

\* cited by examiner

DEVICE STRUCTURE FOR INDUCING LAYOUT DEPENDENT THRESHOLD VOLTAGE SHIFT

PRIORITY CLAIM

The present application claims priority to U.S. Provisional App. No. 63/585,395, entitled "Device Structure for Inducing Layout Dependent Threshold Voltage Shift," filed Sep. 26, 2023, the disclosure of which is incorporated by reference herein in its entirety.

BACKGROUND

Technical Field

Embodiments described herein relate to transistor structures and layouts for semiconductor devices. More particularly, embodiments described herein relate to transistor structures and layouts that include transistors inducing threshold voltage shift in neighboring transistors.

Description of the Related Art

In advanced metal-gate CMOS technology, work function metals are often utilized as gate materials to adjust the threshold voltage for NMOS or PMOS transistors. For instance, selection of the work function metal for the gate material may be used to set the proper threshold voltage for NMOS or PMOS transistors. NMOS and PMOS transistors, however, have very different work function metals. Thus, in CMOS logic circuits or devices that have physically connected NMOS gates and PMOS gates, the merge/joint of the NMOS work function gate material and the PMOS work function gate material may lead to additional threshold voltage shift for one or both of the NMOS gates and the PMOS gates. This threshold voltage shift induced by physical connection of the different work function metals may be referred to as the metal boundary effect. Examples of devices where the metal boundary effect may occur include, but are not limited to, inverters, NAND devices, and NOR devices.

In some instances, it is desirable to have the induced threshold voltage shift due to the metal boundary effect. Current methods for adding the induced threshold voltage shift include the addition of dummy NMOS/PMOS devices next to the active (e.g., device under test) PMOS/NMOS devices, respectively. For instance, dummy NMOS devices may be placed next to active PMOS devices to induce threshold voltage shift in the PMOS devices. Placing the dummy devices, however, requires a minimum number of dummy NMOS/PMOS rows of at least two due to current process constraints. Having at least two dummy rows produces the threshold voltage shift at the sacrifice of circuit or device area. Thus, there is a need to produce desired threshold voltage shifts without the current sacrifices in circuit or device area growth.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which.

Figure 1:
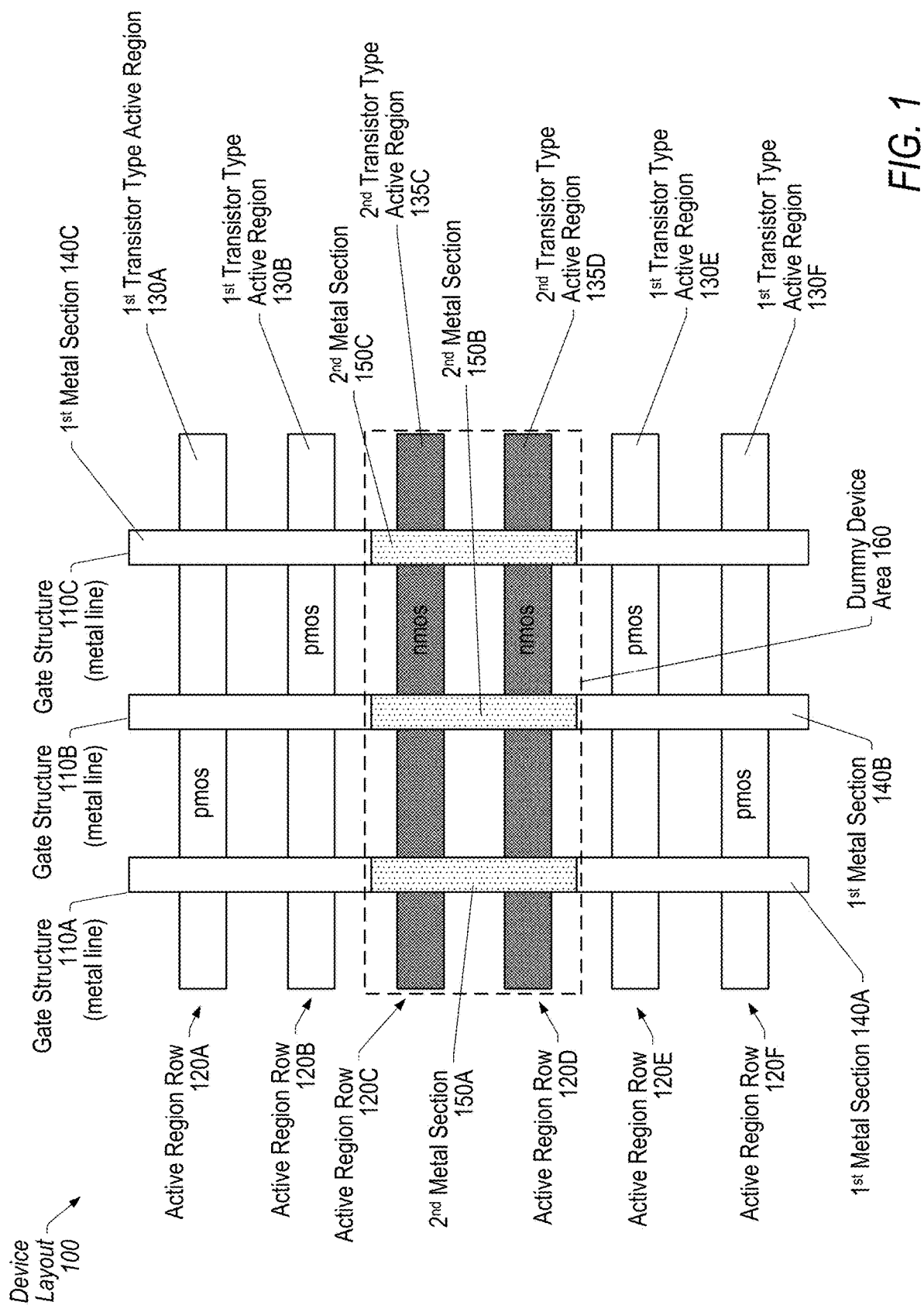
FIG. 1 depicts a topside plan view representation of an example device layout having metal for dummy NMOS transistors neighboring metal for active PMOS transistors, according to some embodiments.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

DETAILED DESCRIPTION OF EMBODIMENTS

The present disclosure is directed to the implementation of transistor devices having active regions of a first transistor type where active transistor sections in the devices have metal gates with the metal having a work function corresponding to the first transistor type and wherein inactive (e.g., dummy) transistor sections in the devices have metal gates with the metal having a work function corresponding to a second transistor type that is complementary to the first transistor type. Metal gates are implemented in various devices that include CMOS (complementary metal-oxide-semiconductor) technologies. The work function of the metals may be selected to set the proper threshold voltages for the NMOS (n-channel metal-oxide-semiconductor) and PMOS (p-channel metal-oxide-semiconductor) transistors in a particular CMOS device.

Typically, NMOS and PMOS transistors have very different work function metals for their gates. In some CMOS devices, or logic circuits, the NMOS and PMOS transistors have gates that are connected. For instance, CMOS devices such as inverters, NANDs, NORs, etc. may have connected NMOS and PMOS metal gates. When the gates are connected, there is a merge location (e.g., joint) between the metal of the NMOS gate and the metal of the PMOS gate. With the differences in chemical composition between these metals and the exchange or movement of certain atoms or ions at the merge location, there may be additional threshold voltage (Vt) shift for one or both of the NMOS and the PMOS transistors. In various instances, the cause of the threshold voltage shift is referred to as a metal boundary effect.

In some embodiments of circuit or device designs, it is desirable to add the additional threshold voltage shift caused by the metal boundary effect to produce (e.g., induce) desired threshold voltage properties in the devices. A current way of inducing the additional threshold voltage shift is to include metal for dummy NMOS (or, alternatively, PMOS) devices next to the metal for complementary active PMOS (or NMOS) device (e.g., device under test (DUT)). FIG. 1 depicts a topside plan view representation of an example device layout having metal for dummy NMOS transistors neighboring metal for active PMOS transistors, according to some embodiments. In the illustrated embodiment, device layout 100 includes three gate structures 110A-C oriented orthogonally to six active region rows 120A-F.

In various embodiments, active region rows 120A-F include active regions (e.g., epitaxy regions including channel and source/drain regions) for either first transistor types (e.g., PMOS or p-type active regions) or second transistor types (e.g., NMOS or n-type active regions). In the example embodiment, active region rows 120A/B/E/F are rows with first transistor type active regions 130A/B/E/F while active region rows 120C/D are rows with second transistor type active regions 135C/D. For instance, first transistor type active regions 130A/B/E/F may be PMOS active regions while second transistor type active regions 135C/D are NMOS active regions, as indicated in FIG. 1. Because of the difference in the type of active regions, active region rows 120A/B/E/F have separate source/drain regions from active region rows 120C/D.

With the different transistor types in active region rows 120A-F, gate structures 110 may be metal lines with different work function (WF) metal sections along their lengths that correspond to the different transistor type active regions. For instance, in the illustrated embodiment, metal lines 110A/B/C include first metal sections 140A/B/C of a first WF metal type and second metal sections 150A/B/C of a second WF metal type. First metal sections 140A/B/C may be metal sections with WFs that correspond to PMOS transistors (e.g., PMOS WF metal sections) since the first metal sections intersect first transistor type active regions 130A/B/E/F in active regions rows 120A/B/E/F. Correspondingly, second metal sections 150A/B/C may be metal sections with WFs that correspond to NMOS transistors (e.g., NMOS WF metal sections) since the second metal sections intersect second transistor type active regions 135C/D in active regions rows 120C/D.

In the illustrated embodiment, device layout 100 is for an active PMOS transistor device. Accordingly, first transistor type active regions 130A/B/E/F in active regions rows 120A/B/E/F form the active (e.g., device under test (DUT)) transistors for device layout 100 while second transistor type active regions 135C/D in active regions rows 120C/D are "inactive" or "dummy" transistors in the device layout. Placing the dummy NMOS transistors in proximity (e.g., neighboring) the active PMOS transistors produces threshold voltage shifts in the active PMOS transistors. Selection of the WF for the metal sections (e.g., second metal sections 150) in the dummy NMOS transistors may produce a desired threshold voltage shift in the neighboring active PMOS transistors. It should be noted that an alternative device layout with active NMOS transistors and dummy PMOS transistors and corresponding WF metal sections may also be contemplated.

Placing dummy NMOS transistors with NMOS WF metal sections neighboring (or in between) active PMOS transistors with PMOS WF metal sections does, however, come at a cost of increased circuit or device area usage. For instance, due to process constraints in current circuit/device designs, the minimum number of rows of dummy NMOS (or PMOS) transistors is at least two (2). Two rows may be the minimum number of rows because the epitaxy of second transistor type active regions 135C/D in active regions rows 120C/D is different from the epitaxy of first transistor type active regions 130A/B/E/F in active regions rows 120A/B/E/F, which typically necessitates a two row differentiation to switch between the different epitaxies. Accordingly, as can be seen in FIG. 1, device layout 100 includes two rows of dummy NMOS transistors to induce work function threshold voltage shift in PMOS transistors above/below the two dummy transistor rows.

To overcome the area cost of current designs, such as device layout 100 shown in FIG. 1, the present disclosure describes various contemplated device layout (e.g., circuit) designs that leverage the metal boundary effect through the implementation of only a single row for dummy MOS "devices" inserted into the layout. In various embodiments, the single row of dummy MOS devices is formed by placing metal sections with the complementary WF function metal over active regions of the same epitaxy (e.g., same transistor type active regions and common source/drain regions) as the active devices in the device layout. Device layouts with these single rows of dummy MOS devices have more efficient utilization of device area while providing the same benefit of inducing work function threshold voltage shift as current designs.

Certain embodiments disclosed herein have four broad elements: 1) a plurality of active regions of a first type of transistor oriented in rows along a first direction in a horizontal dimension; 2) gate structures formed above the substrate oriented in a second direction, orthogonal to the first direction, in the horizontal dimension, 3) a first section of a first metal gate material with a first work function above a first active region in a first row of the first type of transistor, and 4) a second section of a second metal gate material with a second work function above a second active region in a second row of the first type of transistor. In various embodiments, the second metal gate material is adjacent to (e.g., neighboring) the first metal gate material such that the second metal gate material induces a threshold voltage shift in the active transistors associated with the first metal gate material based on differences in chemical composition between these metals and the exchange or movement of certain atoms or ions at the merge location. In certain embodiments, the source/drains in the second active region are electrically floating, making the second active region an inactive or a dummy transistor. In some embodiments, a third section of the first metal gate material with the first work function is above a third active region in a third row of the first type of transistor where the second row is between the first row and the third row. In some embodiments, a cut (e.g., a metal cut or gate cut) may be implemented between the first metal gate material in the first section and the second metal gate material in the third section to inhibit threshold voltage shift in the active transistors associated with the first metal gate material above the third active region.

Various illustrations of embodiments with these broad elements are now described in the present disclosure. It should be noted that the illustrated embodiments of the present disclosure depict design layouts for devices with PMOS active regions and corresponding PMOS active transistors where NMOS work function metals induce threshold voltage shift in some of the PMOS active transistors. These design layouts provide basic building blocks from which many different types of devices may be constructed based on the design layouts. Additionally, embodiments may be contemplated based on the depicted design layouts with NMOS active regions and corresponding NMOS active transistors where PMOS work function metals induce threshold voltage shift in some of the NMOS active transistors.

Figure 2:
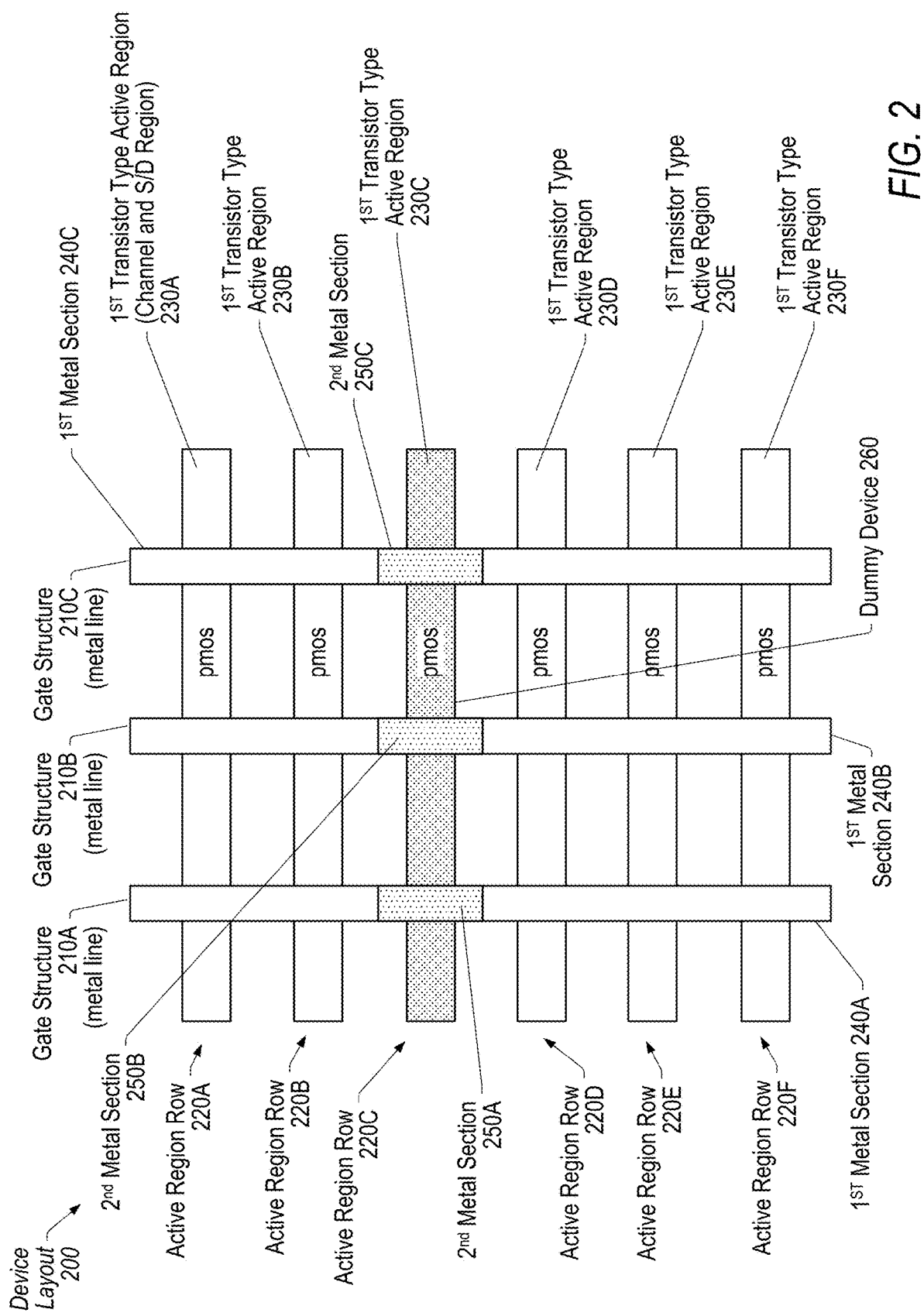
FIG. 2 depicts a topside plan view representation of a contemplated device having a row of NMOS metal sections neighboring active PMOS metal sections with both metal sections being over PMOS active regions, according to some embodiments.

FIG. 2 depicts a topside plan view representation of a contemplated device having a row of NMOS metal sections neighboring active PMOS metal sections with both metal sections being over PMOS active regions, according to some embodiments. In the illustrated embodiment, device layout 200 includes three gate structures 210A-C oriented in a first direction in a horizontal dimension and six active region rows 220A-F oriented in a second direction in the horizontal dimension where the second direction is orthogonal to the first direction. In various embodiments, active region rows 220A-F include first transistor type active regions 230A-F where each active region is the same first transistor type (e.g., PMOS transistor). For instance, first transistor type active regions 230A-F include channel and source/drain regions (e.g., epitaxy regions) for PMOS transistors. With active region rows 220A-F all being the same type of transistors, they may have common type of source/drain regions among the rows using the same epitaxy.

In certain embodiments, gate structures 210A-C have first metal sections 240A-C, respectively, and second metal sections 250A-C, respectively. First metal sections 240A-C may be sections of metal with a work function that corresponds to the transistor type for first transistor type active regions 230A-F. For instance, first metal sections 240A-C may be metal sections with a work function that corresponds to PMOS transistors for first transistor type active regions 230A-F.

In certain embodiments, "dummy" (e.g., inactive) devices are formed in device layout 200 by placing second metal sections 250A-C along gate structures 210A-C. Second metal sections 250A-C may be sections of metal with a work function that corresponds to a complementary transistor type to the transistor type of first transistor type active regions 230A-F. For instance, in the illustrated embodiment, second metal sections 250A-C may be metal sections with a work function that corresponds to NMOS transistors when first transistor type active regions 230A-F are epitaxy regions for PMOS transistors. With second metal sections 250A-C placed along gate structures 210A-C, dummy device 260 is formed in device layout 200.

As shown in FIG. 2, dummy device 260 includes second metal sections 250A-C above first transistor type active region 230C (dotted) in active region row 220C. Having second metal sections 250A-C above first transistor type active region 230C allows dummy device 260 to be formed in device layout 200 while maintaining the same epitaxy (e.g., having the same type of source/drain regions) between active region 230C and the other first transistor type active regions 230A/B/D/E/F in the device layout (e.g., the active regions that are part of active transistors (DUTs)). For instance, active region 230C may have the same type of source/drain regions and have a common well with the other active regions 230A/B/D/E/F. Thus, dummy device 260 is formed in device layout 200 without creating any additional rows of a different epitaxy (e.g., no NMOS epitaxy is needed in addition to the PMOS epitaxy in the device layout).

In certain embodiments, second metal sections 250A-C are selected for dummy device 260 such that the dummy device has a threshold voltage that is high enough for the dummy device to have little to no functionality in device layout 200. With a high enough threshold voltage, the source/drain regions in first transistor type active region 230C may be left electrically floating (e.g., the source/drain regions are disconnected from any power sources or power ground associated with device layout 200). Having such electrically floating source/drain regions in device layout 200 allows a single mask process to be used for all the first type transistors (e.g., PMOS transistor) structures until the processing to introduce second metal sections 250A-C is reached. This process using the same epitaxy across the active regions avoids the need for additional mask processing associated with different epitaxies.

Some embodiments may be contemplated where the source/drain regions in first transistor type active region 230C are connected to other functional components (e.g., power/ground connections or other devices) in device layout 200. For instance, in embodiments where there is little to no side-effects or harm to other transistors in device layout 200, such as the active transistors in active region row 220B or active region row 220D, the source/drain regions in first transistor type active region 230C may be connected to other source/drain regions of the active transistors.

In certain embodiments, as shown in FIG. 2, dummy device 260 includes second metal sections 250A-C that have work functions that are complementary (e.g., counter) to the work functions of first metal sections 240A-C. Accordingly, when second metal sections 250A-C are adjacent (e.g., neighboring) and in contact with first metal sections 240A-C, the second metal sections induces threshold voltage shifts in the adjacent active transistors associated with the first metal sections (e.g., the transistors associated with first transistor type active region 230B and first transistor type active region 230D that are above and below dummy device 260). Note that some threshold voltage shift may also be induced in active transistors at further distances. For instance, first transistor type active regions 230A, 230E, 230F may see some threshold voltage shift depending on the differences in chemical composition between the first and second metals and the amount of atom or ion exchange or movement at the merge location between second metal sections 250A-C and first metal sections 240A-C.

In various embodiments, the work function of second metal sections 250A-C are selected to provide desired threshold voltage shifts in the active transistors of device layout 200. As such, device layout 200 allows a single row (e.g., the row of dummy device 260) to provide desired threshold voltage shifts in the active portions of the device. Causing threshold voltage shift with only a single row of dummy/inactive devices saves on device area usage across the vertical height (e.g., along the direction of gate structures 210) in device layout 200.

In some embodiments, designs for a device layout may be contemplated where it is desired to have some active transistors that are adjacent dummy device 260 not have a threshold voltage shift. In such embodiments, a cut or other break in the metal line of gate structures 210 may be made to prevent atom or ion exchange or movement between second metal sections 250 in dummy device 260 and first metal sections associated with the active transistors for which no threshold voltage shift is desired.

Figure 3:
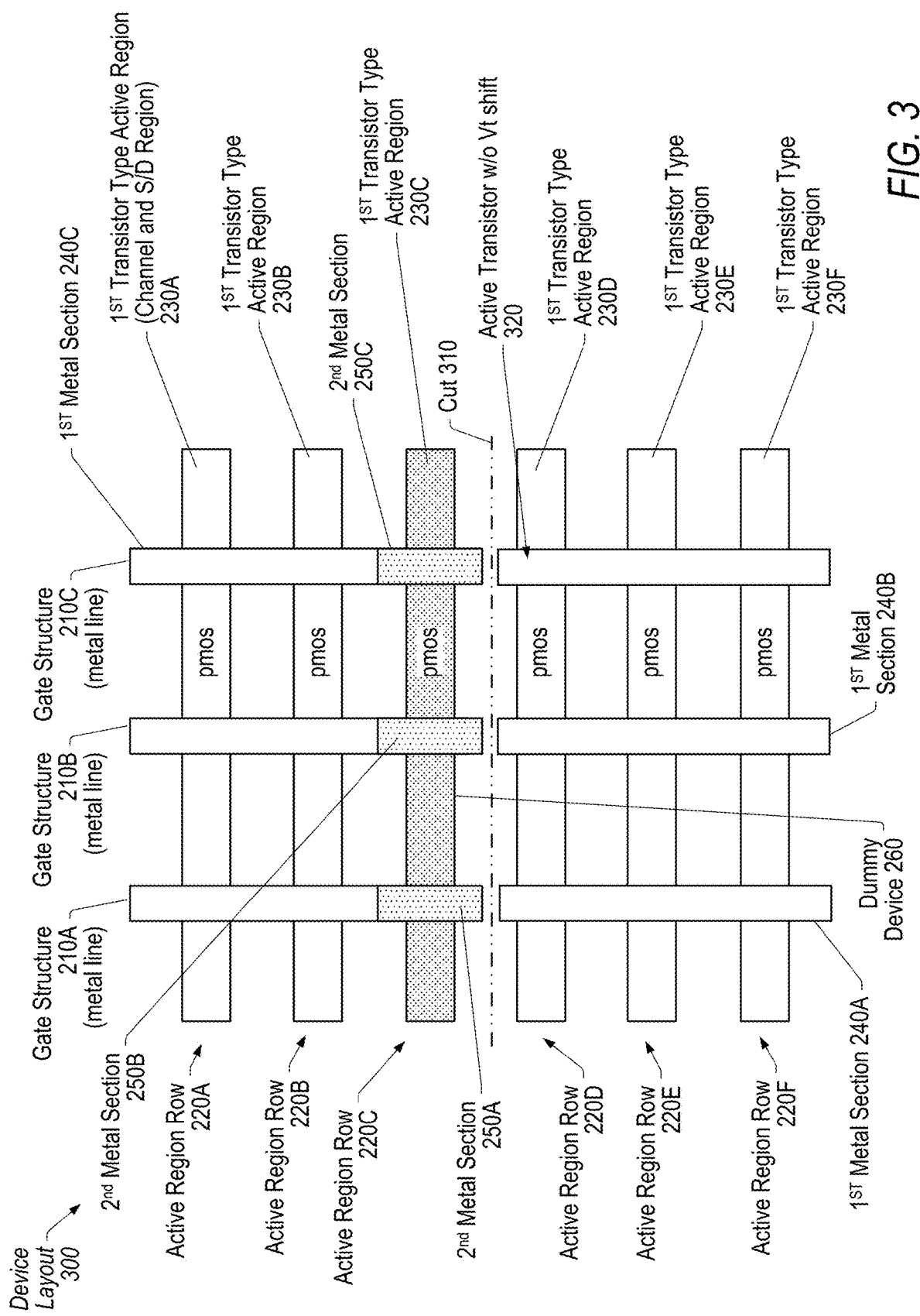
FIG. 3 depicts a topside plan view representation of a contemplated device layout with a cut between NMOS metal sections and a row of active PMOS metal sections to inhibit threshold voltage shift in the active transistors of the row, according to some embodiments.

FIG. 3 depicts a topside plan view representation of a contemplated device layout with a cut between NMOS metal sections and a row of active PMOS metal sections to inhibit threshold voltage shift in the active transistors of the row, according to some embodiments. In the illustrated embodiment, device layout 200 (from FIG. 2), is modified to device layout 300 by placing cut 310 in gate structures 210A/B/C below dummy device 260 and between first metal sections 240A/B/C and second metal sections 250A/B/C. Cut 310 may be formed, for example, by forming a trench in gate structures 210A/B/C along the line of the cut below dummy device 260. Cut 310 inhibits atom or ion exchange or movement between first metal sections 240A/B/C and second metal sections 250A/B/C. By inhibiting the atom or ion exchange or movement between these metal sections, there is no threshold voltage shift in active transistor 320 (or other active transistors along active region row 220D) caused by the presence of gate structures 210A/B/C in dummy device 260. In some embodiments, cut 310 may be positioned at a boundary of a cell or a set of devices/transistors in device layout 300.

Figure 4:
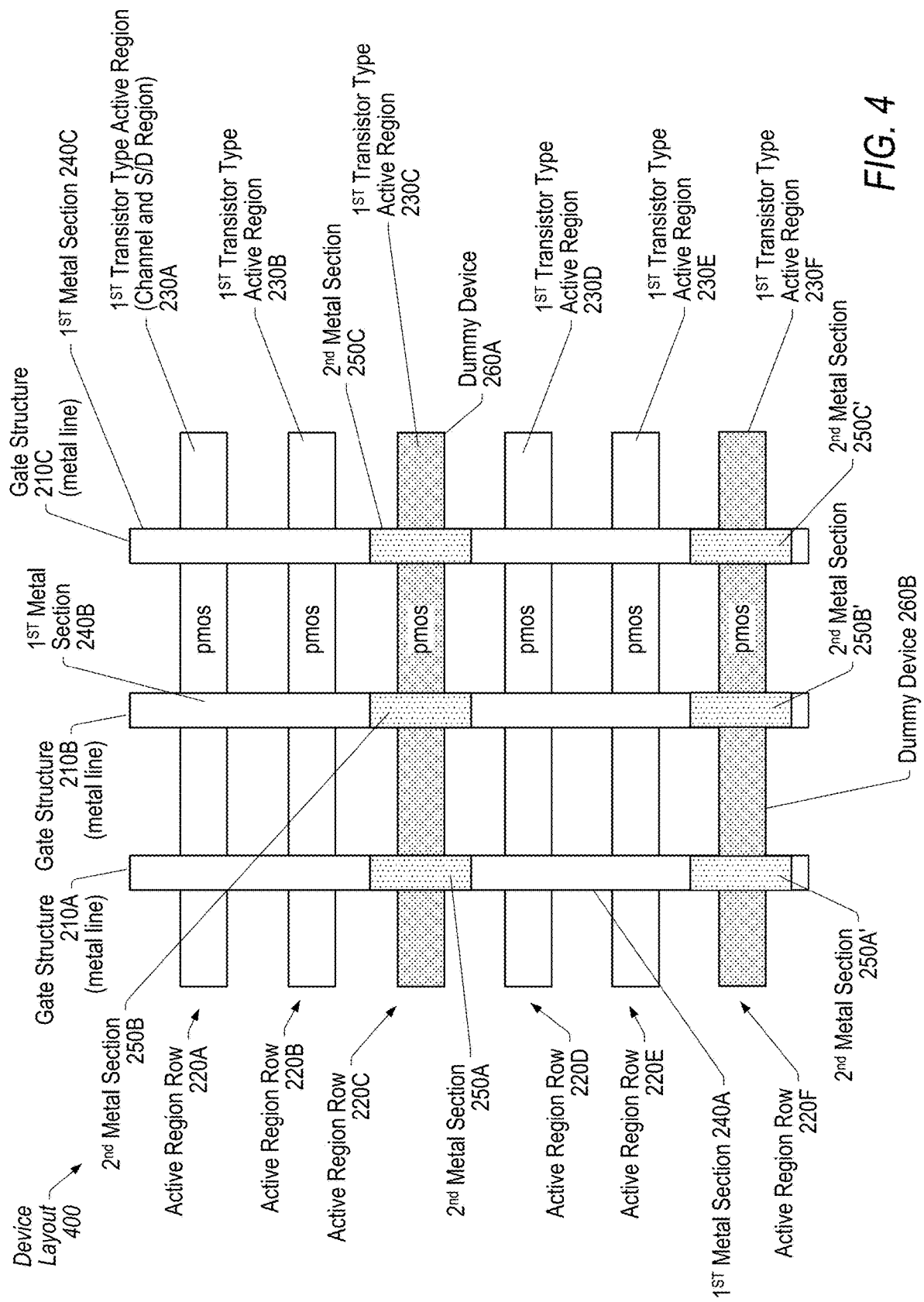
FIG. 4 depicts a topside plan view representation of a contemplated device layout having two rows of NMOS metal sections neighboring active PMOS metal sections with both types of metal sections being over PMOS active regions, according to some embodiments.

In some embodiments, a second row of NMOS metal sections may be placed in a device layout with active PMOS transistors to increase the number of active transistors with threshold voltage shift in the device layout. FIG. 4 depicts a topside plan view representation of a contemplated device layout having two rows of NMOS metal sections neighboring active PMOS metal sections with both types of metal sections being over PMOS active regions, according to some embodiments. In the illustrated embodiment, device layout 200 (from FIG. 2), is modified to device layout 400 by placing a second set of second metal sections 250A'/B'/C' in active region row 220F instead of PMOS metal sections (e.g., first metal sections 240). Accordingly, device layout 400 includes two dummy devices—dummy device 260A in active region row 220C and dummy device 260B in active region row 220F.

Having second metal sections 250 and dummy devices 260 in two rows of device layout 400 increases the number of active transistors with threshold voltage shifts in the device layout. For instance, in the illustrated embodiment, dummy device 260A induces threshold voltage shift in the active transistors of first transistor type active region 230B and first transistor type active region 230D while dummy device 260B induces threshold voltage shift in the active transistors of first transistor type active region 230E. Note that dummy device 260B would also induce threshold voltage shift in the active transistors of another first transistor type active region below active region row 220F unless the dummy device is positioned at a boundary of device layout 400.

For the embodiment of device layout 400, the area cost in the device layout is similar to the area cost of device layout 100, shown in FIG. 1. For instance, both device layouts have a two row area cost for loss of active transistors in the device layout. Device layout 400 may, however, have other advantages over device layout 100. For example, as discussed above, device layout 400 maintains a single type of epitaxial process for implementation of all the active region rows across the device layout. Additionally, device layout 400 may cause 2× numbers of active transistors to have the same amount of threshold voltage effect (e.g., threshold voltage shift) as device layout 100 and with the same area cost.

Figure 5:
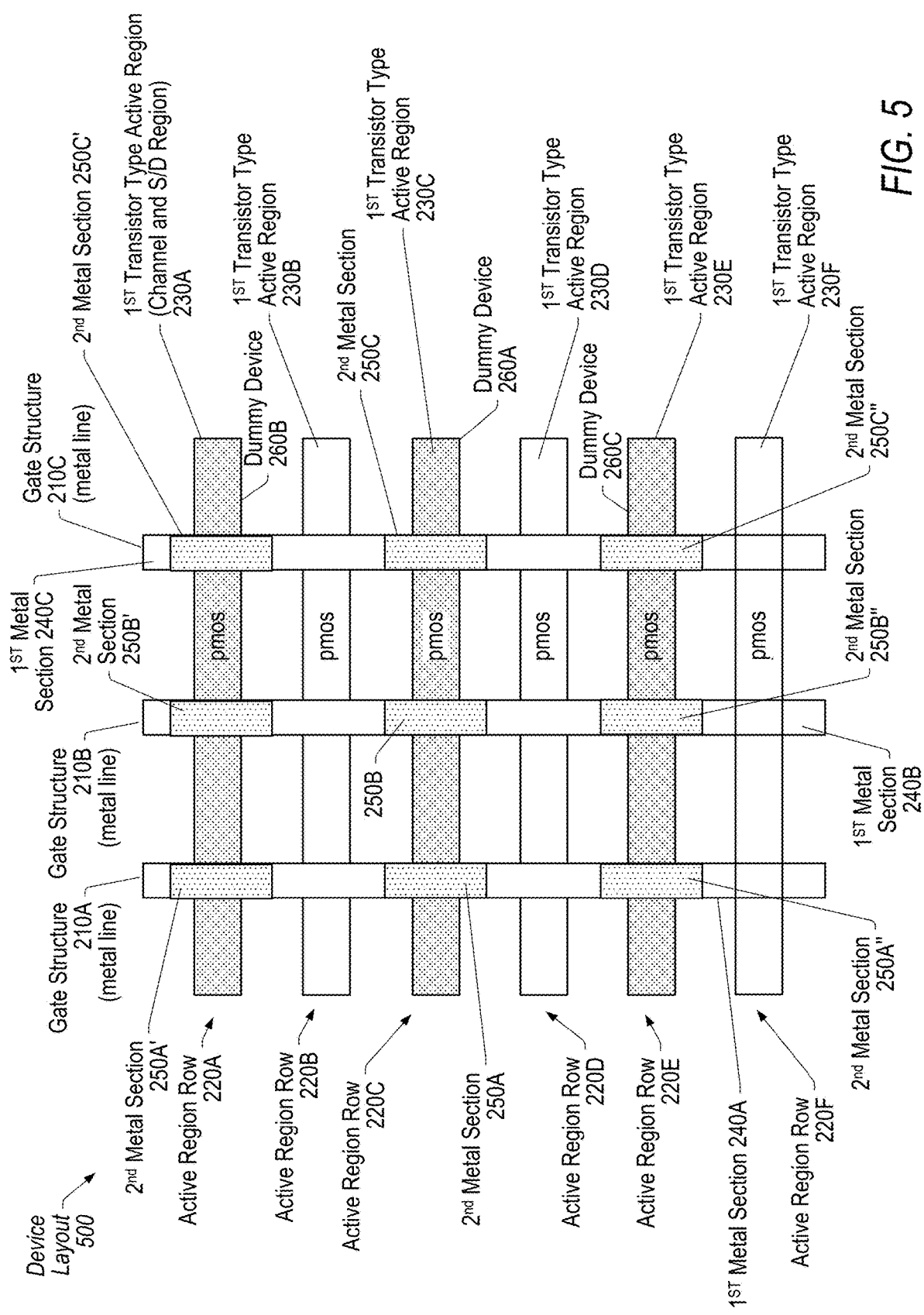
FIG. 5 depicts a topside plan view representation of a contemplated device layout having three rows of NMOS metal sections neighboring active PMOS metal sections with both types of metal sections being over PMOS active regions, according to some embodiments.

FIG. 5 depicts a topside plan view representation of a contemplated device layout having three rows of NMOS metal sections neighboring active PMOS metal sections with both types of metal sections being over PMOS active regions, according to some embodiments. In the illustrated embodiment, device layout 200 (from FIG. 2), is modified to device layout 500 by placing a second set of second metal sections 250A'/B'/C' in active region row 220A and a third set of second metal sections 250A"/B"/C" in active region row 220E instead of PMOS metal sections (e.g., first metal sections 240). Accordingly, device layout 500 includes three dummy devices-dummy device 260A in active region row 220C, dummy device 260B in active region row 220A, and dummy device 260C in active region row 220E.

As shown in FIG. 5, the dummy rows (e.g., active region rows 220A/220C/220E) alternate with the active rows (e.g., active region rows 220B/D/F) such that each active row has one dummy row above and another dummy row below in the illustration. With each active row having a dummy row directly above and directly below, the threshold voltage shift in the active row is larger than if the active row only had one dummy row either above or below the active row.

Accordingly, device layouts may be designed using the second metal sections (e.g., the metal sections with a work function that corresponds to a complementary transistor type to the active transistor) based on using a single row of the second metal sections to produce desired threshold voltage shifts with less area cost or using two (or more) rows of the second metal section to improve other operating properties of the devices along with the desired threshold voltage shifts. Designs for large device layouts may also be contemplated where combinations of single rows and two (or more) rows of the second metal sections are placed in different areas of the device layout to gain advantages of both variations.

Embodiments may also be contemplated where different effects in threshold voltage shift are induced. For instance, in some embodiments, the second metal sections may include metals that increase the threshold voltage in the neighboring active transistors. In other embodiments, the second metal sections may include metals that decrease the threshold voltage in the neighboring active transistors. Yet further embodiments may include device layout designs with some sections increasing threshold voltage in neighboring active transistors and some sections decreasing threshold voltage in neighboring active transistors.

Figure 6:
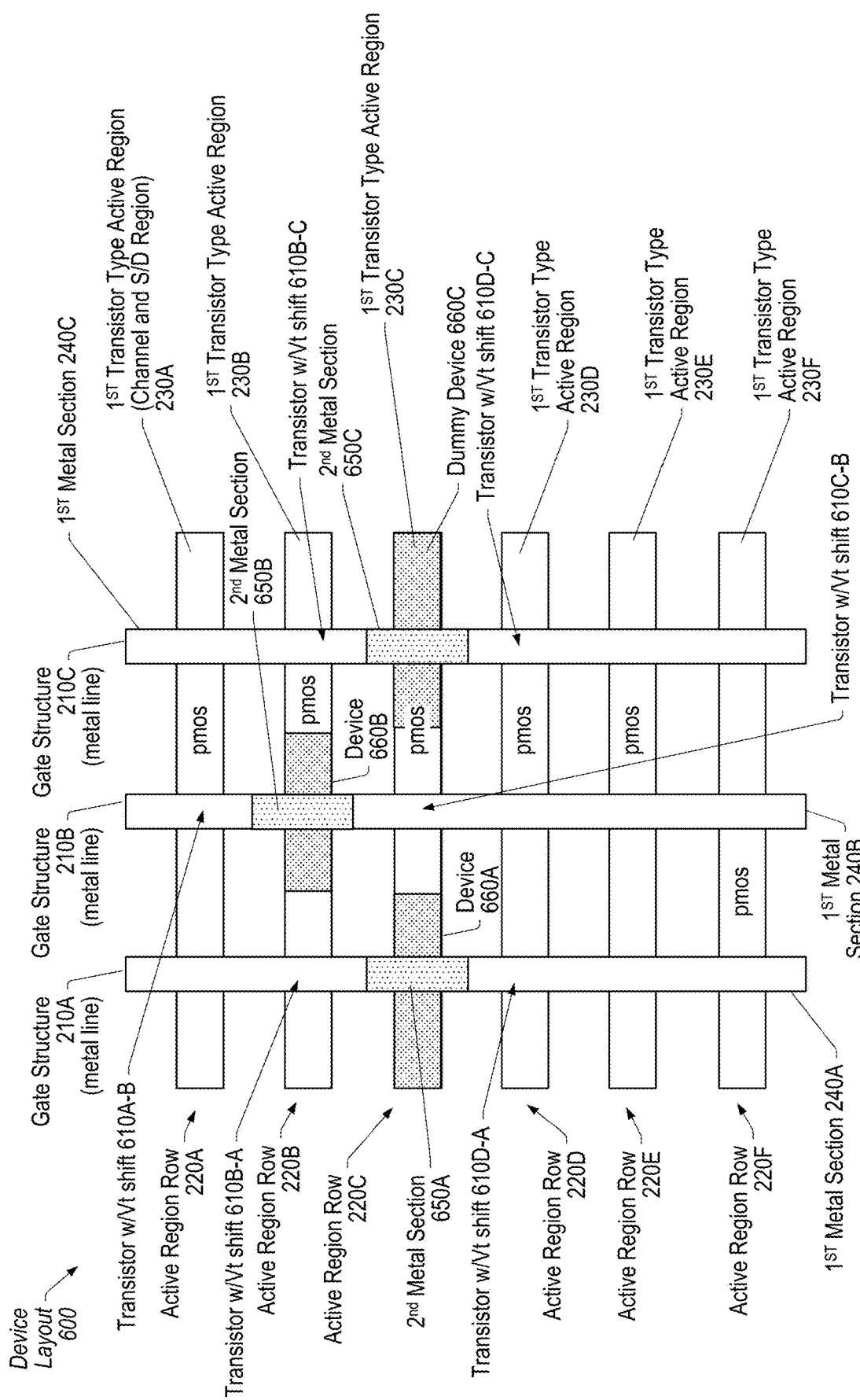
FIG. 6 depicts a topside plan view representation of a contemplated device layout with NMOS metal sections alternating between rows along the x-direction and neighboring active PMOS metal sections with both types of metal sections being over PMOS active regions, according to some embodiments.
Figure 7:
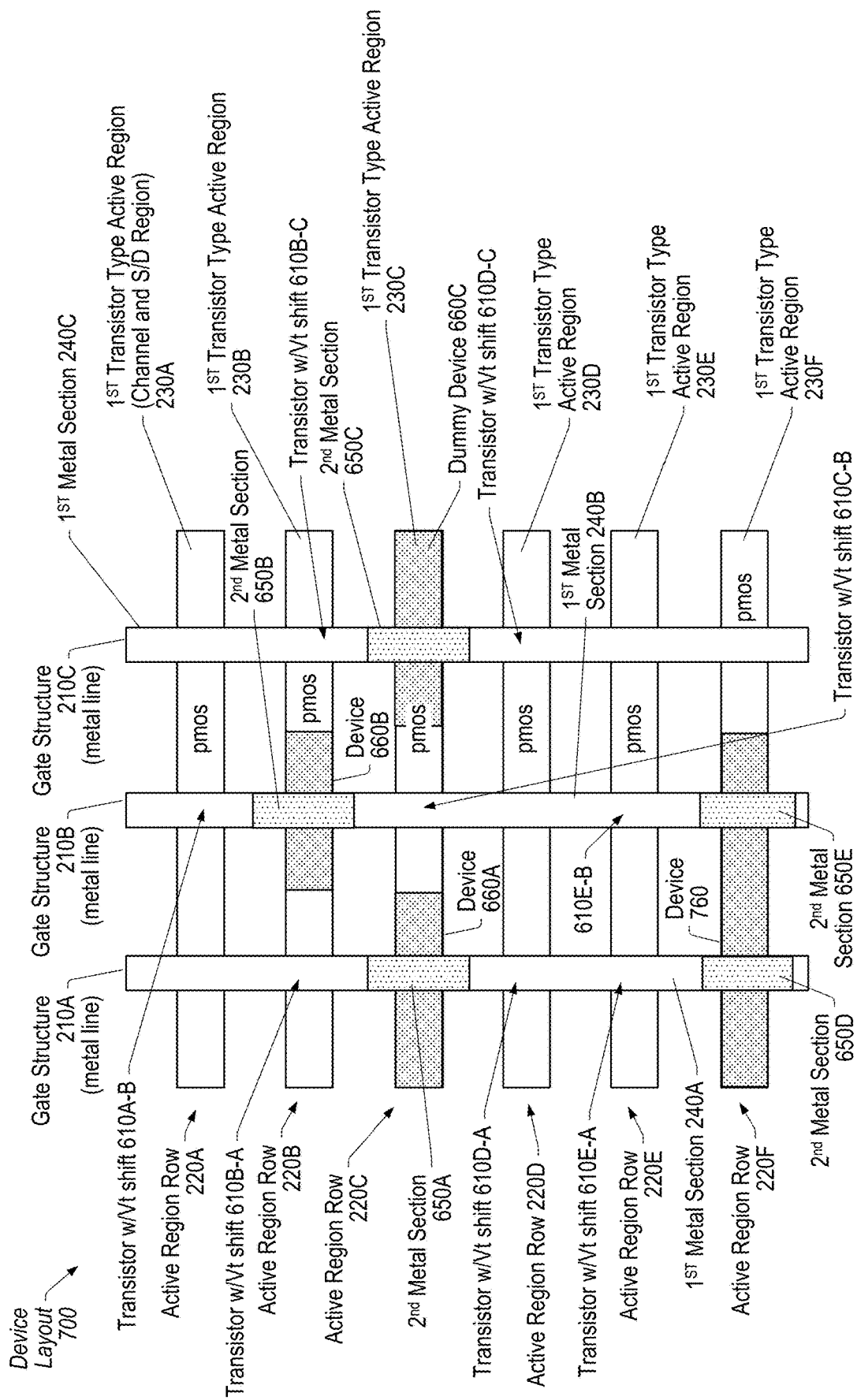
FIG. 7 depicts a topside plan view representation of a contemplated device layout with NMOS metal sections in two columns along a row in the x-direction and neighboring active PMOS metal sections with both types of metal sections being over PMOS active regions, according to some embodiments.

Additional embodiments may be contemplated where second metal sections 250 (e.g., the metal sections with a work function that corresponds to a complementary transistor type to the active transistor) are constrained horizontally in a device layout (e.g., in the horizontal or x-direction of the device layouts as depicted in the figures). The positions of the second metal sections in the x-direction may also be changed between rows of active regions to provide variation in which active transistors in the y-direction have threshold voltage shift. FIGS. 6 and 7 depict examples of some possible variations for placement of the second metal sections in the x-direction (along columns associated with gate structures 210) and the y-direction (along rows associated with active region rows 220) to produce selective threshold voltage shifts in neighboring active transistors based on column, row, or a combination thereof.

FIG. 6 depicts a topside plan view representation of a contemplated device layout with NMOS metal sections alternating between rows along the x-direction and neighboring active PMOS metal sections with both types of metal sections being over PMOS active regions, according to some embodiments. In the illustrated embodiment, device layout 600 includes second metal section 650A along gate structure 210A and in active region row 220C, second metal section 650B along gate structure 210B and in active region row 220B, and second metal section 650C along gate structure 210C and in active region row 220C. Thus, as shown in FIG. 6, second metal sections 650A/B/C alternate rows in the x-direction (e.g., alternate rows between columns of gate structures 210 in the horizontal direction) to form three separate dummy devices-dummy device 660A, dummy device 660B, and dummy device 660C.

With these placements of second metal sections 650A/B/C, the locations of dummy device 660A, dummy device 660B, and dummy device 660C alternate between rows and columns in device layout 600. With the alternating positions of dummy device 660A, dummy device 660B, the active transistors with induced threshold voltage shifts also alternate between rows and columns in device layout 600. For instance, along gate structure 210A (e.g., "column A"), dummy device 660A in active region row 220C induces threshold voltage shift in active transistor 610B-A in active region row 220B above the dummy device and active transistor 610D-A in active region row 220D below the dummy device. Then along gate structure 210B (e.g., "column B"), dummy device 660B in active region row 220B induces threshold voltage shift in active transistor 610A-B in active region row 220A above the dummy device and active transistor 610C-B in active region row 220C below the dummy device. Along gate structure 210C (e.g., "column C"), dummy device 660C in active region row 220C (the same row as dummy device 660A) induces threshold voltage shift in active transistor 610B-C in active region row 220B above the dummy device and active transistor 610D-C in active region row 220D below the dummy device. Accordingly, the active transistors with threshold voltage shifts are alternated between rows in different columns in device layout 600. It should further be noted that metal sections 650A/B/C may be made of the same metal or embodiments may be contemplated where the metals (and corresponding threshold voltage shifts) are different for each of the metal sections and dummy devices.

Embodiments may also be contemplated where the second metal sections 650 are placed across two columns but not a third column horizontally for a single dummy device. FIG. 7 depicts a topside plan view representation of a contemplated device layout with NMOS metal sections in two columns along a row in the x-direction and neighboring active PMOS metal sections with both types of metal sections being over PMOS active regions, according to some embodiments. In the illustrated embodiment, device layout 700 includes dummy devices 660A/B/C from device layout 600 (shown in FIG. 6). Device layout 700 further includes, in active region row 220F, second metal section 650D along gate structure 210A and second metal section 650E along gate structure 210B. Second metal sections 650D/E are in two columns (e.g., "column A" and "column B") in the same row with first metal section 240C in the third column (e.g., "column C"). Second metal sections 650D/E together form dummy device 760. Thus, device layout 600 includes four separate dummy devices—dummy device 660A, dummy device 660B, dummy device 660C, and dummy device 760—where dummy devices 660A/B/C are single-column dummy devices and dummy device 760 is a two-column dummy device.

With dummy device 760 being a two-column dummy device, the dummy device induces threshold voltage shift in active transistors along the same two columns. For instance, in the illustrated embodiment, dummy device 760 induces threshold voltage shift in active transistor 610E-A and active transistor 610E-B, both in active region row 220E. It should be noted that dummy device 760 would also induce threshold voltage shift in the active transistors of another first transistor type active region below active region row 220F unless the dummy device is positioned at a boundary of device layout 700. It should further be noted that the device layouts of FIGS. 6 and 7 are merely provided as examples and additional various device layouts may be contemplated without deviating from the scope of the present disclosure and appended claims. As one example, only a single active region row may contain second metal sections 650 being constrained in the x-direction (e.g., a device layout may only include second metal sections 650A, 650C in active region row 220C).

Example Computer System

Figure 8:
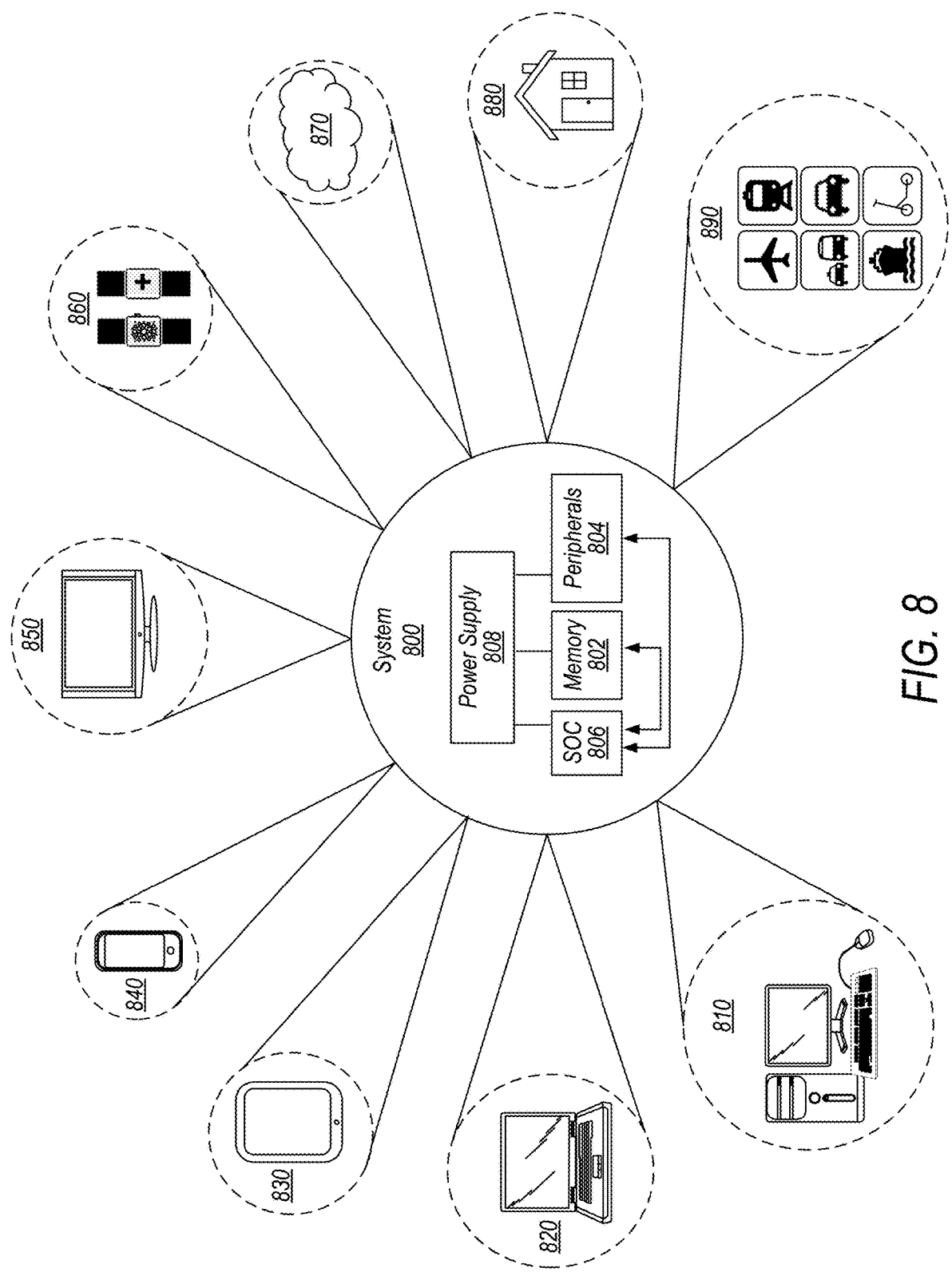
FIG. 8 is a block diagram of one embodiment of an example system.

Turning next to FIG. 8, a block diagram of one embodiment of a system 800 is shown that may incorporate and/or otherwise utilize the methods and mechanisms described herein. In the illustrated embodiment, the system 800 includes at least one instance of a system on chip (SoC) 806 which may include multiple types of processing units, such as a central processing unit (CPU), a graphics processing unit (GPU), or otherwise, a communication fabric, and interfaces to memories and input/output devices. In some embodiments, one or more processors in SoC 806 includes multiple execution lanes and an instruction issue queue. In various embodiments, SoC 806 is coupled to external memory 802, peripherals 804, and power supply 808.

A power supply 808 is also provided which supplies the supply voltages to SoC 806 as well as one or more supply voltages to the memory 802 and/or the peripherals 804. In various embodiments, power supply 808 represents a battery (e.g., a rechargeable battery in a smart phone, laptop or tablet computer, or other device). In some embodiments, more than one instance of SoC 806 is included (and more than one external memory 802 is included as well).

The memory 802 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 804 include any desired circuitry, depending on the type of system 800. For example, in one embodiment, peripherals 804 includes devices for various types of wireless communication, such as Wi-Fi, Bluetooth, cellular, global positioning system, etc. In some embodiments, the peripherals 804 also include additional storage, including RAM storage, solid state storage, or disk storage. The peripherals 804 include user interface devices such as a display screen, including touch display screens or multitouch display screens, keyboard or other input devices, microphones, speakers, etc.

As illustrated, system 800 is shown to have application in a wide range of areas. For example, system 800 may be utilized as part of the chips, circuitry, components, etc., of a desktop computer 810, laptop computer 820, tablet computer 830, cellular or mobile phone 840, or television 850 (or set-top box coupled to a television). Also illustrated is a smartwatch and health monitoring device 860. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 800 may further be used as part of a cloud-based service(s) 870. For example, the previously mentioned devices, and/or other devices, may access computing resources in the cloud (i.e., remotely located hardware and/or software resources). Still further, system 800 may be utilized in one or more devices of a home 880 other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 8 is the application of system 800 to various modes of transportation 890. For example, system 800 may be used in the control and/or entertainment systems of aircraft, trains, buses, cars for hire, private automobiles, waterborne vessels from private boats to cruise liners, scooters (for rent or owned), and so on. In various cases, system 800 may be used to provide automated guidance (e.g., self-driving vehicles), general systems control, and otherwise. These any many other embodiments are possible and are contemplated. It is noted that the devices and applications illustrated in FIG. 8 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112 (f) for that claim element. Should Applicant wish to invoke Section 112 (f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An integrated circuit device, comprising:
a substrate;
a plurality of active regions for a first type of transistor formed in the substrate, wherein the active regions include channel regions and source/drain regions for the first type of transistor, and wherein the active regions are oriented in rows along a first direction in a horizontal dimension relative to the substrate;
a gate structure formed above the substrate in a vertical dimension relative to the substrate, wherein the gate structure is oriented in a column along a second direction in the horizontal dimension, the second direction being perpendicular to the first direction, wherein the gate structure is positioned above at least two rows of active regions in the vertical dimension, and wherein the gate structure includes:
a first section of the gate structure positioned above a first active region of the at least two rows of active regions in the vertical dimension, the first section including a first metal gate material, wherein the first metal gate material is associated with an active transistor of the first type of transistor and has a first work function; and
a second section of the gate structure positioned above a second active region of the at least two rows of active regions in the vertical dimension, wherein the second section includes a second metal gate material, the second metal gate material in second section being adjacent to the first metal gate material in first section, wherein the second metal gate material has a second work function that is different than the first work function, and wherein the second gate material in the second section being adjacent to the first gate material in the first section induces a shift in a threshold voltage of the active transistor.

2. The device of claim 1, wherein the first work function corresponds to the first type of transistor, and wherein the second work function corresponds to a second type of transistor, the second type of transistor being complementary to the first type of transistor.

3. The device of claim 1, wherein the rows of active regions are separated by rows of inactive regions, wherein the inactive regions provide electrical isolation between neighboring rows of active regions.

4. The device of claim 1, wherein the gate structure is positioned above at least one additional row of the active regions in the vertical dimension, and wherein the gate structure further includes:
a third section of the gate structure positioned above the at least one additional row of the active regions in the vertical dimension, the third section including the first metal gate material, wherein the third section is adjacent the second section on an opposing side of the second section from the first section in the second direction.

5. The device of claim 4, wherein the first metal gate material in the third section is adjacent the second metal gate material in the second section.

6. The device of claim 5, wherein the first metal gate material in the third section is associated with an active transistor of the first type of transistor, and wherein the second gate material in the second section being adjacent to the first gate material in the third section induces a shift in a threshold voltage of the active transistor.

7. The device of claim 6, wherein the gate structure further includes:
a fourth section of the gate structure positioned above the at least one additional row of the active regions in the vertical dimension, the fourth section including the second metal gate material, wherein the fourth section is adjacent the third section on an opposing side of the third section from the second section in the second direction;
wherein both the second gate material in the second section and the second gate material in the fourth section being adjacent to the first gate material in the third section induces a shift in a threshold voltage of the active transistor of the third section that is greater than the shift in the threshold voltage when the second gate material is present only in either the second section or the fourth section.

8. The device of claim 1, further comprising:
a second gate structure formed above the substrate in the vertical dimension, wherein the second gate structure is oriented in a column along the second direction in the horizontal dimension, wherein the second gate structure is separated apart from the gate structure in the first direction, wherein the second gate structure is positioned above the at least two rows of active regions in the vertical dimension, and wherein the second gate structure includes:
a first section of the second gate structure positioned above a third active region of the at least two rows of active regions, the first section including the first metal gate material; and
a second section of the second gate structure positioned above a fourth active region of the at least two rows of active regions, wherein the second section is adjacent to the first section in the second gate structure, and wherein the second section includes the second metal gate material.

9. The device of claim 1, wherein the source/drain regions in the second active region are electrically floating.

10. An integrated circuit device, comprising:
a substrate;
a plurality of active regions for a first type of transistor formed in the substrate, wherein the active regions includes channel regions and source/drain regions for the first type of transistor, and wherein the active regions are oriented in rows along a first direction in a horizontal dimension relative to the substrate;
a gate structure formed above the substrate in a vertical dimension relative to the substrate, wherein the gate structure is oriented in a column along a second direction in the horizontal dimension, the second direction being perpendicular to the first direction, wherein the gate structure is positioned above at least two rows of active regions in the vertical dimension, and wherein the gate structure includes:

a first section of the gate structure associated with an active transistor of the first type of transistor, the first section being positioned above a first active region of the at least two rows of active regions in the vertical dimension, the first section including a first metal gate material that has a first work function that corresponds to the active transistor; and
a second section of the gate structure positioned above a second active region of the at least two rows of active regions in the vertical dimension, wherein the second section is adjacent to the first section in the gate structure, wherein the second section includes a second metal gate material, wherein the second metal gate material has a second work function that corresponds to a second type of transistor, the second type of transistor being complementary to the first type of transistor and an inactive transistor, and wherein the second gate material in the second section being adjacent to the first gate material in the first section induces a shift in a threshold voltage of the active transistor.

11. The device of claim 10, wherein the first active region includes p-type channel regions and source/drain regions for the first type of transistor, and wherein the second work function is an n-type work function.

12. The device of claim 10, wherein the first active region includes n-type channel regions and source/drain regions for the first type of transistor, and wherein the second work function is a p-type work function.

13. The device of claim 10, wherein the gate structure is positioned above at least one additional row of the active regions in the vertical dimension, and wherein the gate structure further includes:
a third section of the gate structure positioned above the at least one additional row of the active regions in the vertical dimension, the third section including the first metal gate material, wherein the third section is adjacent the second section on an opposing side of the second section from the first section in the second direction.

14. The device of claim 10, further comprising:
a second gate structure formed above the substrate in the vertical dimension, wherein the second gate structure is oriented in a column along the second direction in the horizontal dimension, wherein the second gate structure is separated apart from the gate structure in the first direction, wherein the second gate structure is positioned above the at least two rows of active regions in the vertical dimension, and wherein the second gate structure includes:
a first section of the second gate structure positioned above a third active region of the at least two rows of active regions, the first section including the first metal gate material; and
a second section of the second gate structure positioned above a fourth active region of the at least two rows of active regions, wherein the second section is adjacent to the first section in the second gate structure, and wherein the second section includes the second metal gate material.

15. The device of claim 14, wherein the fourth active region is part of a same row of the active regions as the second active region, the fourth active region being a different portion of the same row of active regions from the second active region.

16. The device of claim 14, wherein the fourth active region is in a different row of the active regions from the second active region.

17. The device of claim 14, wherein the source/drain regions in the second active region are electrically floating.

18. An integrated circuit device, comprising:
a substrate;
a plurality of active regions for a first type of transistor formed in the substrate, wherein the active regions includes channel regions and source/drain regions for the first type of transistor, and wherein the active regions are oriented in rows along a first direction in a horizontal dimension relative to the substrate;
a plurality of gate structures formed above the substrate in a vertical dimension relative to the substrate, wherein the gate structures are oriented in columns along a second direction in the horizontal dimension, the second direction being perpendicular to the first direction, wherein the gate structures are positioned above two or more rows of active regions in the vertical dimension;
wherein a first gate structure includes:
a first section of the first gate structure positioned above a first active region of the two or more rows of active regions in the vertical dimension, the first section including a first metal gate material, wherein the first metal gate material has a first work function that corresponds to the first type of transistor; and
a second section of the first gate structure positioned above a second active region of the two or more rows of active regions in the vertical dimension, wherein the second section is adjacent to the first section in the first gate structure, wherein the second section includes a second metal gate material, and wherein the second metal gate material has a second work function that is a counter-type work function to the first type of transistor;

wherein a second gate structure includes:
a first section of the second gate structure positioned above a third active region of the two or more rows of active regions in the vertical dimension, the first section including the first metal gate material; and
a second section of the second gate structure positioned above a fourth active region of the two or more rows of active regions in the vertical dimension, wherein the second section is adjacent to the first section in the second gate structure, wherein the second section includes the second metal gate material.

19. The device of claim 18, wherein the third active region is part of a same row of the active regions as the first active region, the third active region being a different portion of the same row of active regions from the first active region, and wherein the fourth active region is part of a same row of the active regions as the second active region, the fourth active region being a different portion of the same row of active regions from the second active region.

20. The device of claim 18, wherein the first gate structure further includes:
a third section of the first gate structure positioned above at least a seventh active region of the two or more rows of active regions in the vertical dimension, the third section including the first metal gate material, wherein the third section is adjacent the second section on an opposing side of the second section from the first section in the second direction; and
a fourth section of the first gate structure positioned above an eighth active region of the two or more rows of active regions in the vertical dimension, wherein the fourth section includes the second metal gate material, and wherein the fourth section is adjacent the third section on an opposing side of the third section from the second section in the second direction.

\* \* \* \* \*